United States Patent [19]

Armstrong

[11] 3,912,545

[45] Oct. 14, 1975

[54] PROCESS AND PRODUCT FOR MAKING A SINGLE SUPPLY N-CHANNEL SILICON GATE DEVICE

[75] Inventor: William E. Armstrong, Tempe, Ariz.

[73] Assignee: Motorola, Inc., Chicago, Ill.

[22] Filed: May 13, 1974

[21] Appl. No.: 469,487

[52] U.S. Cl. .................... 148/1.5; 307/304; 357/23; 357/91

[51] Int. Cl.[2] ........................................ H01L 21/265

[58] Field of Search ........ 148/1.5; 307/304; 357/23, 357/91

[56] References Cited

UNITED STATES PATENTS

| | | | |
|---|---|---|---|
| 3,461,361 | 8/1969 | Delivorias | 148/1.5 X |
| 3,653,978 | 4/1972 | Robinson et al. | 148/1.5 |
| 3,789,504 | 2/1974 | Jaddam | 148/1.5 X |

*Primary Examiner*—C. Lovell
*Assistant Examiner*—J. M. Davis
*Attorney, Agent, or Firm*—Vincent J. Rauner; Willis E. Higgins

[57] ABSTRACT

A process is described wherein an N-channel silicon gate device operates from a single voltage supply. This process includes an ion implantation step into the gate region of both the load and switch devices for adjusting upwards the threshold voltage of such N-channel silicon gate load and switch devices. This ion implantation of the gate region utilizes the dosage and ion implant energy as factors in determining the change in the threshold voltage. The ion implantation is in a region essentially at the surface of the gate region and as such appears to be a change in the $Q_{ss}$ term of the device. The effect of the ion implantation is to increase upwards the threshold voltage of the structure as compared with the expected threshold voltage based on the resistivity level of the starting material of the wafer. The overall effect of this process is to provide an active device having a higher output voltage than can be expected from using the starting resistivity material. The output voltage is approximately 25% greater using this process because the body effect turns out to be much lower in the present process than in the prior art process.

16 Claims, 8 Drawing Figures

DOSE vs THRESHOLD AND BODY EFFECT

PROCESS AND PRODUCT FOR MAKING A SINGLE SUPPLY N-CHANNEL SILICON GATE DEVICE

BACKGROUND OF THE INVENTION

Ion implantation has been used in the manufacture of many types of semiconductor devices. For example, ion implantation has been used for adjusting the threshold of the load device in an MOS inverter circuit. However, when such a process step was used the following results were obtained which are substantially different from the results of the present process.

In such an environment the adjustment of the load devices would cause the load devices to operate in the depletion mode. This means that the threshold voltages would go below zero in the case of N-channel silicon gate devices. In our situation, the devices do not adjust to the point where they go depletion but actually the threshold voltages are increased so they actually operate in the opposite manner. Ion implantation has also been used to adjust the threshold voltage for P-channel devices in order to lower the threshold voltage such that the P-channel metal gate devices would be compatible with $T^2L$ circuits. This is contrasted with the present process which is using the ion implantation to adjust upwards the threshold voltage.

A competing process to the present invention utilizes a starting substrate of relatively low resistivity material, i.e. the resistivity lying within the range of 1 to 3 ohms centimeter material. However, when using the relatively low resistivity starting material and connecting the completed devices to one power supply, the output signal available from such a device is in the 2.8 to 3 volt range. This is compared to the process wherein the starting material is a relatively high resistivity material lying within the range of 10–45 ohm centimeter and the gate regions of both the switch and the load devices are given an ion implant according to the dosage and concentrations as set out hereinafter. This device made by this process gives a substantially lower body effect resulting in a substantially higher output voltage lying within the range of approximately 4 volts when using a 5 volt power supply. Essentially this is a 25% improvement over the prior art process.

In review, ion implantation in the prior art has been used to lower the threshold voltage on P-channel devices as well as to make the N-channel devices operate in a depletion load. Additionally, the prior art process using a 5 volt single power supply has resulted in high body effects causing adverse condition of the output voltage such that the maximum voltage obtainable lies within the range of 2.8 to 3 volts. The present process has caused the threshold voltage to be adjusted upward which is exactly opposite from the prior art thinking and hence an unobvious result and has effectively reduced the body effect of the structure on which the process has been practiced thereby resulting in a higher output voltage of about 4 volts using a 5 volt power supply.

SUMMARY OF THE INVENTION

The present invention relates to the manufacture of N-channel silicon gate devices and, more particularly, relates to a process for using ion implantation for raising the threshold voltage of such N-channel silicon gate devices.

Another object of the present invention is the use of different parameters in the ion implantation process for achieving an upward adjustment of the threshold voltage of N-channel silicon gate products.

A further object of the present invention is the use of the implant energy parameter and an implant dosage parameter of the ion implantation process for adjusting upwardly the threshold voltage of N-channel silicon gate devices without increasing the body effect of those devices.

A still further object of the present invention is to use the thickness of the surface passivation layer for adjusting the dosage and depth of the implanted ions into an N-channel silicon gate region for adjusting upwardly the threshold voltage of the devices.

These and other objects of the present invention can be more fully understood by reference to the following drawings.

BRIEF DESCRIPTION OF THE INVENTION

The present invention is directed to a process for adjusting upwardly the threshold voltage of N-channel silicon gate devices. In a typical situation of an inverter circuit, both gate regions of the load and switch devices are implanted with a selected implant energy and with a selected ion dosage. The implanted ions are placed in the substrate body at very small distances within the body and appear as surface charge ($Q_{ss}$) on the body. More specifically, the implantation of the ions into the substrate body has the effect of changing the $Q_{ss}$ charge on the surface of the substrate.

This process is practiced on a semiconductor substrate having a resistivity lying within the range of 10 to 45 ohms-cm. This range of resistivity is desirable because it allows lower body effect and junction capacitance.

While ion implantation has been used to form resistors in other devices deep within the semiconductor body, the implantation as hereinafter more fully described is located at the surface of the semiconductor body and does not penetrate more than 10,000A into the body. This results in an effective change of the $Q_{ss}$ or the surface charge of the semiconductor body and hence increases the threshold voltage of the structure. The increase of the threshold voltage has the following advantages. Dynamic storage is possible and low input and output leakages are easier.

One of the factors to be careful of in the practice of the present process is the use of too thick a surface passivation layer through which the implantation takes place. It has been found that as a general rule that a surface oxide thickness of 1000A has been found to give best results. Additionally, it is expected that raising the temperature of an implanted substrate to a temperature causing thermal oxidation of the surface after the implant would adversely affect the threshold voltages obtained during the implant at a predetermined implant level and at a predetermined dosage. This change occurs because of a depletion of boron from the surface into the oxide grown during the oxidation step. Accordingly, such oxidation should be avoided or its effect taken into consideration prior to the original implant.

DETAILED DESCRIPTION OF THE INVENTION

Figure 1:
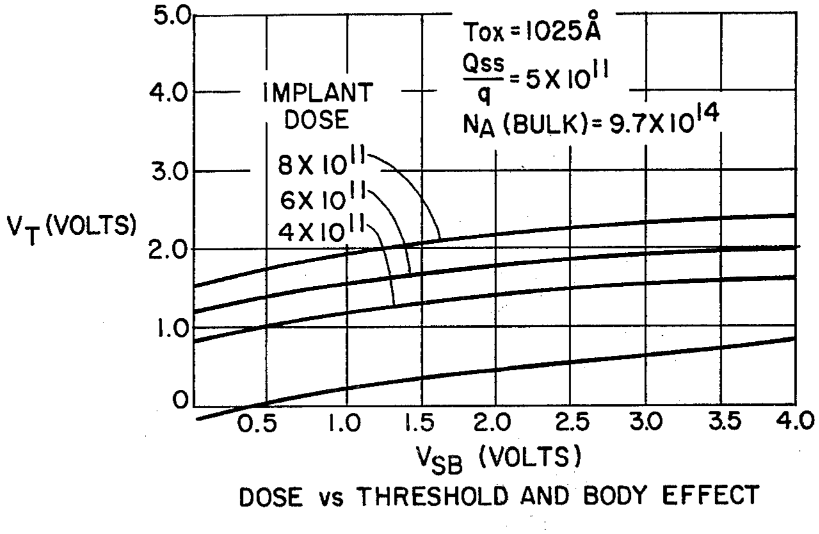
FIG. 1 is a graph showing the results of increasing the implant dose on the threshold and body effect.

Referring to FIG. 1 there is shown a graph showing the change of threshold voltage and body effect obtained from increasing the implant dosage. Very little change in body effect is observed because of the shallow depth of the implant. As the dose increases, however, the depletion region moves toward the surface and would eventually reach the implanted region. When this happens, the effective body effect will start at a higher value in a normal substrate body effect and decrease until the depletion region extends beyond the implanted region. Fortunately, implants in that dose range are not useful as they result in undesired threshold voltages.

Figure 2A:
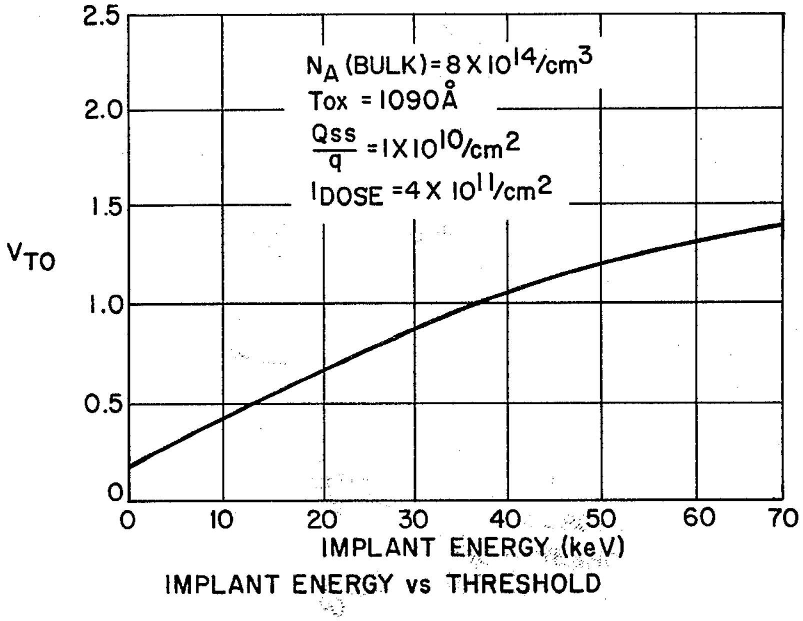
FIGS. 2*a* and 2*b* illustrate the effect of increasing implant energy when the implant dose is held constant at $4 \times 10^{11}$/centimeter squared.
Figure 2B:
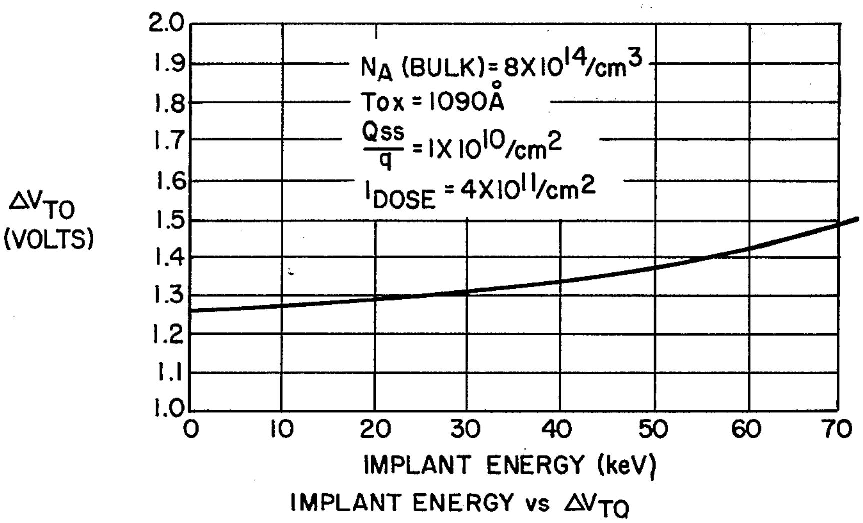

Referring to FIGS. 2*a* and 2*b* there can be seen a graph illustrating the effect of increasing the implant energy when the dose is held constant at $4 \times 10^{11}$/centimeter square. The increase in threshold is a result of the additional charge actually penetrating the silicon dioxide at higher energies. At the same time, the increase in body effect is due to the combination of shallower depletion regions, because of the increased effective doping, and a deeper implant penetration.

Figure 3:
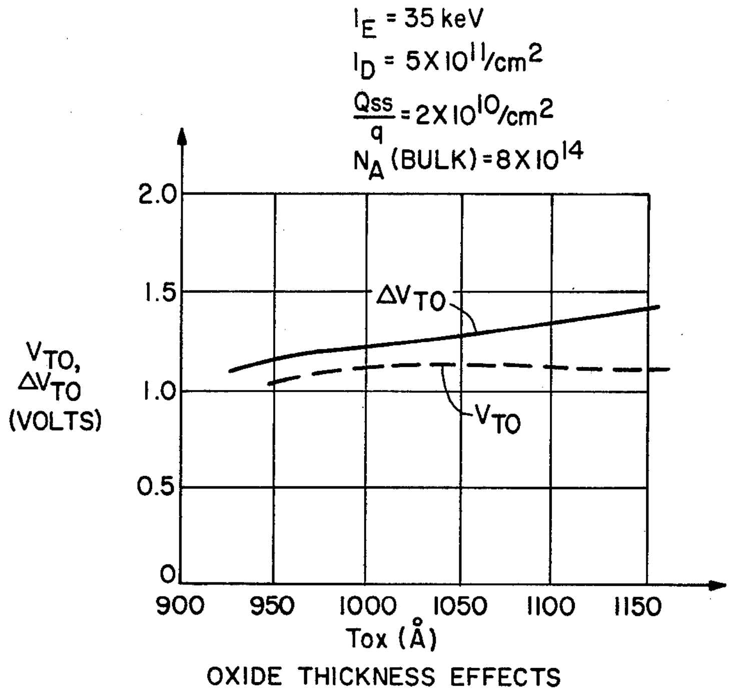
FIG. 3 is a graph showing the effect of oxide thickness variations on the threshold and body effect of implanted devices.

Referring to FIG. 3 there can be seen a graph illustrating the effect of oxide thickness variations on the threshold and body effect of implanting the devices. It has been noted that the threshold voltage actually levels off and starts to decrease as oxide thickness increases. This is due to the fact that the thicker oxide allows fewer of the implanted ions from reaching the silicon, thus decreasing the threshold. No such effect would exist, of course, if the implant peak were not close to the silicon/silicon dioxide interface for nominal oxide thicknesses.

Figure 4:
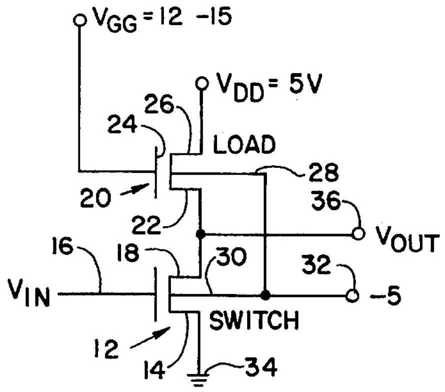
FIG. 4 is a schematic view of an inverter circuit made according to the prior art processes.

Referring to FIG. 4 there can be seen a typical inverter circuit 10 connected according to the prior art processes. A first N-channel MOS device 12 has a source 14, gate 16 and drain electrode 18. A second N-channel MOS device 20 has a source electrode 22, a gate electrode 24 and a drain electrode 26. The gate 24 of the load inverter 20 is connected to a voltage $V_{GG}$ lying within the range of 12 to 15 volts. The drain electrode 26 is connected to the $V_{DD}$ voltage of 5 volts. The substrate electrodes are shown at 28 for the MOS device 20 and 30 for the MOS device 12. The substrate electrodes are connected together and are connected to a −5 volt power supply represented at 32. The source electrode 14 of the switch device 12 is connected to ground 34. The drain electrode 18 of the switching MOS device 12 is connected to the source electrode 22 of the load MOS device 20 and is connected to the output terminal at 36. The input signal is available on the gate electrode 16 of the switch device 12.

Figures 6, 7:
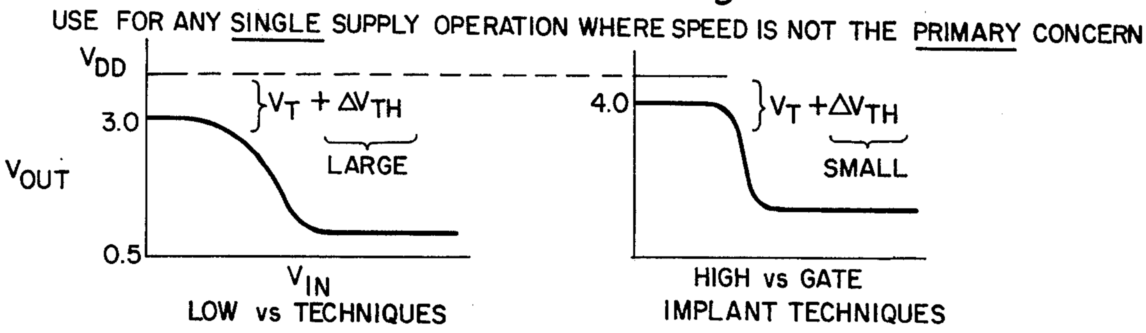
FIG. 6 shows an output waveform of the circuit shown in FIG. 4.
FIG. 7 shows an output waveform of the circuit shown in FIG. 5.

Referring to FIG. 6 there can be seen an output waveform which is typically obtainable which is shown in FIG. 4. FIG. 6 shows that the output voltage has a maximum swing of 3 volts going to a minimum of 0.5 volts. The drop of 2 volts between the $V_{OUT}$ and $V_{DD}$ is consumed in the threshold voltage $V_T$ and the body effect $\Delta V_{TH}$. Accordingly, with a relatively high threshold voltage and a high body effect the output voltage is reduced to 3 volts.

Figure 5:
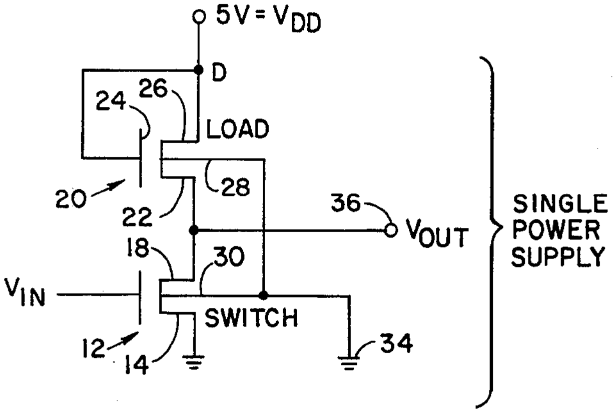
FIG. 5 shows an inverter circuit made according to the present process.

Referring to FIG. 5 there can be seen the inverter circuit connected according to the present process. The same elements will be given the same numerical identifiers as used in FIG. 4. The structure as shown in FIG. 5 is made with a starting material having a resistivity lying within the range of 15 to 20 ohm-cm. A threshold voltage of $0.7 \pm 0.3$ is the typical range of threshold voltages utilized. The target threshold voltage specification is achieved by having an implant energy of 35 KEV and an implant dosage of $2 \times 10^{11}$/centimeter squared. Since the ion implantation is essentially at the surface of the substrate and lies within the top 10,000A of the substrate material there is essentially no change in body effect. This can be seen by referring to FIG. 7 which shows an output voltage of the output waveform obtained at the output terminal 36. In this case a 4 volt output voltage is typically available and the difference between the available $V_{DD}$ and the 4 volt output swing is essentially consumed in the threshold voltage. A much smaller amount is consumed in the body effect.

Referring back to FIG. 5, the connection of the new single power supply inverter circuit is quite different when compared with the inverter circuit shown in FIG. 4. The source electrode 14 of the first N-channel MOS device is connected to ground while the gate electrode is connected to the input terminal. The drain electrode is connected to the source electrode 22 of the load N-channel MOS device as well as to the output terminal 36. The gate electrode 24 of the load device 20 is connected to the drain electrode 26 of the load device terminal and they are both connected to the 5 volt $V_{DD}$ power supply. The substrate electrode 26 is connected to the substrate electrode 30 and both are connected to ground 34. The configuration shown in FIG. 5 only requires a single power supply and that is 5 volts.

The reason that the new process results in a single power supply is because the threshold voltage of the gate region is adjusted upwards by a surface ion implantation without effectively changing the body effect of the gate regions. The ion implantation is generally kept at a surface region no deeper than 10,000A, and the implant dosage is kept below $5 \times 10^{11}/cm^2$.

While the invention has been particularly shown and described in reference to the preferred embodiments thereof, it will be understood by those skilled in the art that changes in form and details may be made therein without departing from the spirit and scope of the invention.

What is claimed is:

1. A process for increasing the threshold voltage of an N-channel MOS device comprising the step of:

implanting acceptor ions of one conductivity type into the channel surface portion of channel region of a semiconductor body having source and drain regions of the opposite type conductivity at an energy level and in an amount sufficient to increase the threshold voltage of said MOS device.

2. The process as recited in claim 1 wherein the acceptor ions are selected from the group of boron and gallium.

3. The process as recited in claim 1 wherein boron is used as the acceptor ions.

4. The process as recited in claim 1 wherein the semiconductor body has a resistivity range of about 10 to 45 ohm centimeter material.

5. A process for increasing the threshold voltage of a MOS device having source and drain regions of one conductivity type and a channel portion in a semiconductor body comprising the step of:

implanting ions of opposite conductivity type to said source and drain regions into the channel surface portion of the semiconductor body at an energy level and in an amount sufficient to increase the threshold voltage of said MOS device.

6. The process of claim 5 in which the ion implantation is carried out within about the upper 10,000A of said substrate member.

7. The process of claim 6 in which said ion implantation step is made with an implant energy within the range of about 10 KEV to 70 KEV.

8. The process of claim 7 in which said ion implanting step is made with an implant dosage lying within the range of about $2 \times 10^{11}$ to about $8 \times 10^{11}$ impurities/cm$^2$.

9. A process for increasing the threshold voltage of an MOS device having source and drain regions of one conductivity type and a channel portion in a semiconductor body, which comprises:

forming a surface passivation layer over said channel portion in a thickness that will allow implantation of ions at the surface of said channel portion in a concentration sufficient to increase the threshold voltage of the MOS device, and ion implanting ions of opposite conductivity type to said source and drain regions through said surface passivation layer into the surface portion of said channel portion at an energy level and in an amount sufficient to increase the threshold voltage of said MOS device.

10. The process of claim 9 wherein said passivation layer is an oxide and has a thickness no greater than about 10,000A.

11. The process of claim 10 wherein the ion implantation is carried out within about the upper 10,000A of said substrate member.

12. A process for increasing the threshold voltage of an N-channel silicon gate device;

providing a starting substrate member having a resistivity lying within the range of 10 to 45 ohm centimeter;

forming a surface passivation layer no greater than 10,000A thick; and implanting boron ions within the upper 10,000Å of the substrate member.

13. A process for increasing the threshold voltage of an N-channel silicon gate device as recited in claim 12, wherein:

said ion implanting step is made with an implant energy of 35,000 electron volts.

14. A process for increasing the threshold voltage of an N-channel silicon gate device as recited in claim 12, wherein:

said ion implanting step is made with an implant dosage of $2 \times 10^{11}$/cm$^2$.

15. A process for increasing the threshold voltage of an N-channel silicon gate device as recited in claim 12, wherein:

said ion implanting step is made with an implant dosage lying within the range of $2 \times 10^{11}$ to $8 \times 10^{11}$ impurities/cm$^2$.

16. A process for increasing the threshold voltage of an N-channel silicon gate device as recited in claim 12, wherein:

said ion implanting step is made with an implant energy lying within the range of 10 KEV to 70 KEV.

* * * * *